United States Patent
Kawasumi

(10) Patent No.: US 7,206,218 B1
(45) Date of Patent: Apr. 17, 2007

(54) STABLE MEMORY CELL WITH IMPROVED OPERATION SPEED

(75) Inventor: Atsushi Kawasumi, Takatsu (JP)

(73) Assignee: Kabushiki Kaisha Toshiba, Kawasaki-shi (JP)

(*) Notice: Subject to any disclaimer, the term of this patent is extended or adjusted under 35 U.S.C. 154(b) by 0 days.

(21) Appl. No.: 10/906,030

(22) Filed: Jan. 31, 2005

(51) Int. Cl.
*G11C 11/00* (2006.01)

(52) U.S. Cl. .................................. 365/154; 365/202

(58) Field of Classification Search ................ 365/154
See application file for complete search history.

(56) References Cited

U.S. PATENT DOCUMENTS

| | | | | |
|---|---|---|---|---|
| 5,128,896 | A * | 7/1992 | Yamada et al. | 365/189.01 |
| 5,576,560 | A * | 11/1996 | Runaldue et al. | 257/208 |
| 5,837,573 | A * | 11/1998 | Guo | 257/E27.098 |
| 6,920,061 | B2 * | 7/2005 | Bhavnagarwala et al. | 365/154 |
| 2001/0015916 | A1 * | 8/2001 | Huang | 365/189.11 |

OTHER PUBLICATIONS

Ando, K. et al., A 0.9-ns-access, 700-MHz SRAM Macro using a Configurable Organization Technique . . . , 1998 Symposium on VLSI Circuits Digest of Technical Papers, pp. 182-183.
Marshall, A. et al., SOI Design: Analog, Memory and Digital Techniques, ISBN 07-7923-7640-4, Chapter 8.6, pp. 197-200.
Bernstein, K. et al., SOI Circuit Design Concepts, ISBN 0-7923-7762-1, Chapter 6.4, pp. 131-137.

* cited by examiner

*Primary Examiner*—Thong Q. Le
(74) *Attorney, Agent, or Firm*—Watchstone P+D, Plc; Stephen B. Parker

(57) ABSTRACT

A memory cell, including a word line, a bit line, a first node storing a bit value voltage level, a driver transistor coupled between the first node and a ground level, and at least one data transfer transistor having a gate electrode coupled to the word line, a source electrode coupled to the bit line, and a drain electrode coupled to the first node, wherein a channel length of the at least one data transfer transistor is smaller than a channel length of the driver transistor. By making the channel length of a data transfer transistor smaller than that of a driver transistor to which the data transfer transistor is coupled, operation speed and in particular read operation speed of the memory cell is improved, while maintaining memory cell stability.

14 Claims, 2 Drawing Sheets

STABLE MEMORY CELL WITH IMPROVED OPERATION SPEED

FIELD OF THE INVENTION

The present invention relates generally to solid state memory devices, such as semiconductor memory arrays, and more particularly to memory cell structures for such arrays.

BACKGROUND OF THE INVENTION

The insulated-gate field-effect transistor (IGFET) has been arranged in various configurations of bistable stages, or cells, resembling bipolar transistor flip-flops. Unlike a conventional bipolar junction transistor, in which both majority and minority carriers are required for operation, an IGFET is a unipolar transistor to the extent that only majority carriers are required for operation. Conduction in an IGFET device is controlled by signals applied to a control electrode, without any current flow between the control electrode and controlled electrodes because the control electrode in insulated from the controlled electrodes. IGFET memory cells consume significantly less power than bipolar transistor cells.

In the background art, each IGFET memory cell generally requires at least four leads to the cell, a pair of cross-coupled inverter IGFET devices, a pair of load devices, and two additional gating IGFET devices for transferring information into and out of the cell.

A typical memory cell 100 as shown in FIG. 1 includes a pair of pull-up PMOS (p-channel metal-oxide-semiconductor) inverter transistors 101 and 102, and a pair of pull-down NMOS driver transistors 103 and 104. The gate electrodes of transistors 101 and 103 are cross-coupled to the gate electrodes of transistors 102 and 104. The transistors 101–104 comprise a data storage device, which serves to store bit values of "0" or "1." The memory cell 100 further includes a pair of NMOS transfer transistors 105 and 106. Transistors 105 and 106 comprise data transfer devices, which serve to transfer information into and out of the memory cell 100.

Transfer transistor 105 is coupled to bit line BL and to node 1001 between the drain electrode of transistor 101 and the source electrode of transistor 103. Transfer transistor 106 is similarly coupled to complementary bit line/BL and to node 1002 between the drain electrode of transistor 102 and the source electrode of transistor 104. A gate electrode of each of transfer transistors 105 and 106 is coupled to word line WL. The transfer transistors 105 and 106 are thus made conductive by activating word line WL (i.e., by supplying a high voltage level to WL), which electrically connects bit line BL to node 1001 and complementary bit line/BL to node 1002.

The bit value of a memory cell is conventionally considered to be the value at node 1001, which is read out on bit line BL. When a bit value at node 1001 is "1" ($V_{1001}=V_{cc}$) a bit value at node 1002 is "0" ($V_{1002}=0$). Consequently, in this state, transistor 101 is turned on and transistor 103 is turned off by the voltage at node 1002, thereby keeping the voltage of node 1001 at $V_{cc}$. Similarly, the voltage $V_{cc}$ at node 1001 turns off transistor 102 and turns on transistor 104, thereby coupling node 1002 to ground and keeping the voltage of node 1002 at $V_{1002}=0$.

At the beginning of a read operation, bit lines BL and/BL are pre-charged to the supply voltage by a pre-charge signal. The word line WL is then enabled to turn on data transfer transistors 105 and 106 and thereby to connect bit-line BL to node 1001 and complementary bit-line/BL to node 1002. Because both bit line BL and node 1001 are at the supply voltage $V_{cc}$, the voltage on bit line BL remains substantially unchanged. However, because complementary bit line/BL is now coupled to ground through turned-on transistors 106 and 104, the pre-charge voltage at bit line/BL will be discharged to ground. As is well-known, sense amplifiers coupled to the bit lines BL and/BL sense the difference between the voltages on bit line BL and complementary bit line/BL to determine that memory cell 100 stores a bit value of "1."

However, as the voltage on complementary bit-line/BL decreases below the supply voltage Vcc, the voltage at node 1002 will begin to rise above ground because transistors 104 and 106 will act as a voltage divider. Thus, there exists the possibility that the voltage at node 1002 may rise to a level that undesirably causes the memory cell 100 to switch its stored value from a "1" to a "0."

As one conventional way to prevent this, the resistance of the transfer transistor 106 may be made higher than the resistance of driver transistor 104, such as by lengthening the channel of transistor 106. Conventionally, the IGFET devices have width-to-length ratios which are interrelated. The width w of each channel is the distance across the substrate surface of the semiconductor channel in a direction perpendicular to the direction of current in the channel. The length l of each channel is the distance between the source and drain electrodes in the direction of the current in the channel. The load devices have essentially equal width-to-length ratios w/l (L), and the gating devices also have essentially equal width-to-length ratios w/l (G). A relative ratio R relating the width-to-length ratios of the load and gating devices is given as:

$$R = \frac{w/l(L)}{w/l(G)}.$$

If in a particular cell the ratio R is too small, stored information can be lost during a read operation because both cross-coupled inverter devices will be pulled into conduction rather than just one of them. This loss of information occurs because the voltage drop across one inverter transistor, which is correctly conducting, exceeds the threshold voltage of the opposite inverter transistor and causes it to also conduct but in error. On the other hand, if the ratio R is too large, bit-writing into the memory cell is made more difficult because very large voltage swings are required on the bit lines and on the word line for changing the state of the cell. This difficulty of changing the state of the cell occurs because the large ratio R involves devices which require more current through either inverter transistor to establish a source-to-drain voltage that exceeds the threshold voltage of the opposite inverter transistor.

Consequently, there is a trade-off balance that must be reached between providing a highly stable memory cell in which data is reliably stored without the possibility of loss of information, and providing a memory cell that has a fast read operation.

In the background art, in order to provide a stability index of a memory cell, the Static Noise Margin or SNM has been used. SNM is typically measured or simulated at the DC or quiescent state.

In particular, the stability of a memory cell may be described in terms of three stability modes: a storage mode;

an active mode; and a transition mode. A memory cell is operating in the storage mode when it is not being accessed during a read or a write cycle. A memory cell is operating in the active mode when it is being accessed during a read or a write cycle. A cell is operating in the transition mode when it is transitioning between the active mode and the storage mode.

There are typical static noise margins associated with each of these operating modes that are used to determine the stability of the memory cell. When the memory cell is in the storage mode, the voltage on word line WL is a logic low, so that data transfer transistors 105 and 106 are substantially non-conductive, which isolates storage nodes 1001 and 1002 from the influence of the bit lines BL and/BL. The SNM during the storage mode varies, depending on the power supply voltage and the threshold voltage (Vth) variation between pull down transistors 103 and 104.

When the memory cell is in the active mode, the voltage of word line WL is a logic high, causing data transfer transistors 105 and 106 to be conductive. Storage nodes 1001 and 1002 are coupled to bit lines BL and/BL, respectively, and the memory cell 10 will be undergoing either a read operation or a write operation. During the active mode, the SNM varies according to the power supply voltage; the conductance ratio of transfer transistor 105 with respect to pull down transistor 103 (with a maximum gate voltage of pull down transistor 103 being set by the threshold voltage Vth of transfer transistor 105); the conductance ratio of transfer transistor 106 with respect to pull down transistor 104 (with the maximum gate voltage of pull down transistor 104 being set by the threshold voltage Vth of coupling transistor 106); and the amount of mismatch if any between the threshold voltages Vth and the conductance of pull down transistors 103 and 104.

When the memory cell is transitioning between the storage mode and the active mode, the voltage of word line WL is greater than ground, but less than supply voltage Vcc. As the word line voltage increases, the SNM associated with the storage mode degrades. As the word line voltage continues to increase, the storage mode SNM starts to become negative. As the storage mode SNM becomes negative, the active mode SNM should become positive to prevent the memory cell from becoming unstable and improperly changing logic states. Typically, the storage mode SNM should remain positive with word line voltages less than a few volts below the supply voltage, assuming a supply voltage Vcc that is approximately equal to 5 volts.

Using the SNM as an index indicates that stability of the memory cell is increased as the drivability of the data transfer transistors is reduced, e.g., by lengthening the channel in order to reduce the w/l ratio of the data transfer transistors with respect to the pull-down transistors. This result would appear to be reasonable since any noise or disturbance to the memory cell would be transmitted by the data transfer transistors.

However, reducing the drivability of the transfer gate transistors causes an increase of the word line load, and a decrease of memory cell current. Consequently, reduction in transfer gate drivability results in a longer read operation of the memory cell.

There, thus, exists a need in the art for, among other things, improvements to semiconductor memory cells to eliminate the shortcomings mentioned above.

SUMMARY OF THE INVENTION

The illustrative embodiments of the present invention eliminate the shortcomings in the background art and provides a significant advance in the art, by providing an improved semiconductor memory cell structure with good stability and fast read operation.

According to one embodiment, the present invention provides a memory cell, including a word line, a bit line, a first node storing a bit value voltage level, a driver transistor coupled between the first node and a ground level, and at least one data transfer transistor having a gate electrode coupled to the word line, a source electrode coupled to the bit line, and a drain electrode coupled to the first node, wherein a channel length of the at least one data transfer transistor is smaller than a channel length of the driver transistor.

In some embodiments, the driver transistor comprises a pull-down transistor, the memory cell further comprising a pull-up transistor coupled between the first node and a voltage supply.

In some embodiments, a voltage threshold of the data transfer transistor is smaller than a voltage threshold of the driver transistor.

In some embodiments, where a voltage threshold of the driver transistor is denoted by dVth, a voltage threshold of the data transfer transistor is denoted by Vth−dvth/2.

In some embodiments, the memory cell further includes a complementary bit line; a second pull-up transistor and a second pull-down transistor connected in series between the voltage supply and ground, a second node between the second pull-up and pull-down transistors storing a complementary bit value; and a second data transfer transistor coupled between the complementary bit line and the second node, and having a gate electrode coupled to the word line; wherein a channel length of the at least second data transfer transistor is smaller than a channel length of the second pull-down transistor.

According to some other illustrative embodiments of the invention, a method of manufacturing a memory cell is performed that includes: providing a data transfer transistor having a channel length smaller than a channel length of a bit value storing transistor to which the data transfer transistor is connected.

In some embodiments, the method further includes providing the channel length of the data transfer transistor smaller than the channel length of the bit value storing transistor to achieve stability.

In some embodiments, the method further includes achieving the stability by having the transfer transistor channel length reduced rather than reducing the drivability of the data transfer transistors.

In some embodiments, the method further includes manufacturing the memory cell to include: a word line; a bit line; a first node storing a bit value voltage level; a driver transistor coupled between the first node and a ground level; and at least one data transfer transistor having a gate electrode coupled to the word line, a source electrode coupled to the bit line, and a drain electrode coupled to the first node; wherein a channel length of the at least one data transfer transistor is smaller than a channel length of the driver transistor.

In some embodiments, the method further includes having the driver transistor comprise a pull-down transistor, the memory cell further comprise a pull-up transistor coupled between the first node and a voltage supply.

In some embodiments, the method further includes having the a voltage threshold of the data transfer transistor smaller than a voltage threshold of the driver transistor.

In some embodiments, the method further includes having a voltage threshold of the driver transistor denoted by dVth, a voltage threshold of the data transfer transistor is denoted by Vth−dVth/2.

In some embodiments, the method further includes: a complementary bit line; a second pull-up transistor and a second pull-down transistor connected in series between the voltage supply and ground, a second node between the second pull-up and pull-down transistors storing a complementary bit value; and a second data transfer transistor coupled between the complementary bit line and the second node, and having a gate electrode coupled to the word line; wherein a channel length of the at least second data transfer transistor is smaller than a channel length of the second pull-down transistor.

According to some other embodiments of the invention, a memory cell is provided that includes: a word line; a bit line; a complementary bit line; a first node storing a bit value voltage level; a second node storing a complementary bit value voltage level; a first pull-down driver transistor coupled between the first node and a ground level; a first pull-up transistor coupled between the first node and a supply voltage source; a first data transfer transistor having a gate electrode coupled to the word line, a source electrode coupled to the bit line, and a drain electrode coupled to the first node; a second pull-up transistor and a second pull-down transistor connected in series between the supply voltage source and ground; and a second data transfer transistor coupled between the complementary bit line and the second node, and having a gate electrode coupled to the word line; wherein a channel length of the first data transfer transistor is smaller than a channel length of the first pull-down driver transistor, and a channel length of the second data transfer transistor is smaller than a channel length of the second pull-down transistor.

According to some embodiments of the invention, a method of achieving stability for the manufacture a memory cell is performed that includes: providing a data transfer transistor having a reduced channel length as compared to a channel length of a bit value storing transistor to which the data transfer transistor is connected.

In some embodiments, the method further includes achieving the stability by having the transfer transistor channel length reduced rather than reducing the drivability of the data transfer transistors.

In some embodiments, the method further includes having the memory cell include: a word line; a bit line; a first node storing a bit value voltage level; a driver transistor coupled between the first node and a ground level; and at least one data transfer transistor having a gate electrode coupled to the word line, a source electrode coupled to the bit line, and a drain electrode coupled to the first node; wherein a channel length of the at least one data transfer transistor is smaller than a channel length of the driver transistor.

The above and/or other aspects, features and/or advantages of various embodiments will be further appreciated in view of the following description in conjunction with the accompanying figures. Various embodiments can include and/or exclude different aspects, features and/or advantages where applicable. In addition, various embodiments can combine one or more aspect or feature of other embodiments where applicable. The descriptions of aspects, features and/ or advantages of particular embodiments should not be construed as limiting other embodiments or the claims.

BRIEF DESCRIPTION OF THE DRAWINGS

The illustrative embodiments of the present invention are shown by a way of example, and not limitation, in the accompanying figures, in which.

DETAILED DESCRIPTION OF THE EMBODIMENTS

While the present invention may be embodied in many different forms, a number of illustrative embodiments are described herein with the understanding that the present disclosure is to be considered as providing examples of the principles of the invention and that such examples are not intended to limit the invention to illustrative embodiments described herein and/or illustrated herein.

It has been discovered by the present inventor that using SNM to estimate memory cell stability is not always accurate, because SNM is measured or simulated at the DC state, while the memory cell is operated or used at the AC state. The present inventor has determined, when estimating memory cell stability at the AC state, that reducing the drivability of the data transfer transistors is not as important a factor in achieving good stability as was thought according to the conventional thinking of the background art.

Figure 1:
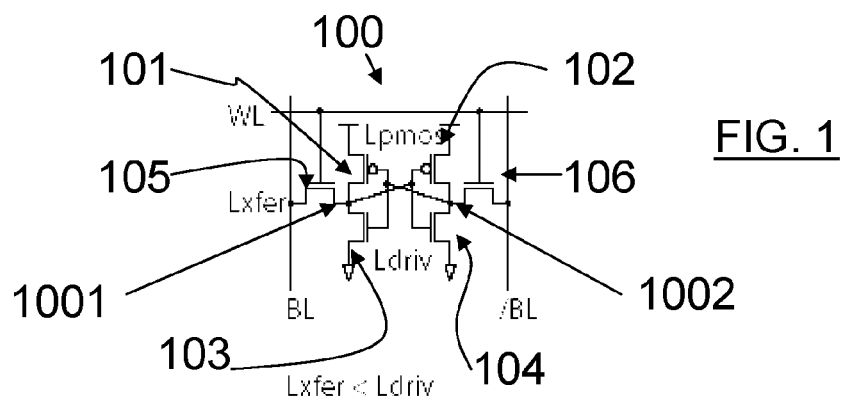
FIG. 1 is a circuit diagram of a memory cell according to an illustrative embodiment of the invention.
Figure 2:
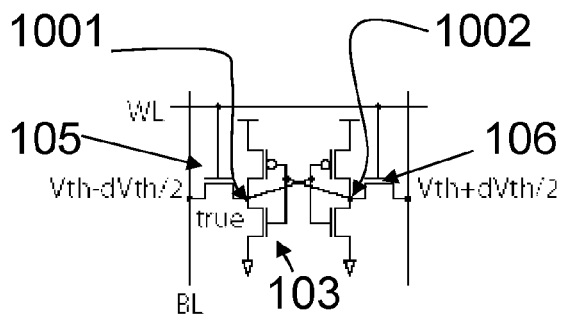
FIG. 2 is a circuit diagram of the memory cell of FIG. 1, illustrating threshold voltage values according to an embodiment of the invention.

According to an embodiment of the present invention, as indicated in FIG. 1, the length of the channel of the data transfer transistors 105, 106 is made smaller than the length of the channel of the NMOS driver transistors 103, 104. In this manner, for example as shown in FIG. 2, the threshold voltage Vth data transfer transistor 105 is reduced by one half of the threshold voltage dVth of NMOS driver transistor 103.

When node 1001 is "true" or at a high logic level (i.e., storing a bit value of "1"), driver transistor 103 will be turned off and PMOS transistor 101 will be turned on, while node 1002 will be at a low logic level, with driver transistor 104 being turned on and PMOS transistor 102 being turned off.

Figure 3:
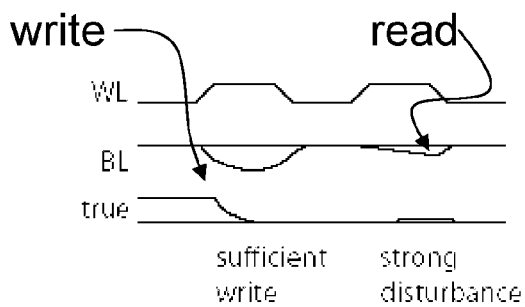
FIG. 3 is a waveform diagram of the operation of the memory cell as configured in FIG. 2.

Consequently, the threshold voltage level that must be overcome by bit line BL is Vth−dVth/2, while the threshold voltage level that must be overcome by complementary bit line/BL is Vth+dVth/2. As shown in FIG. 3, when bit line BL is driven for a write operation to store a "0" bit value, the "true" level is pulled down sufficiently to a low voltage level to stably store a "0" value. And during a read operation, when bit line BL is pre-charged, there is created a strong disturbance that can be detected by the sense amplifier stage (not shown in FIG. 2).

Figure 4:
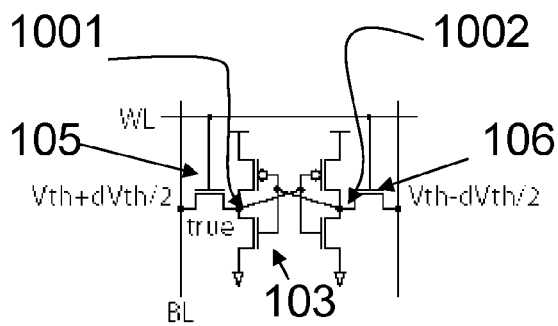
FIG. 4 is a circuit diagram of the memory cell of FIG. 1, illustrating threshold voltage values according to a reduced transfer transistor drivability.
Figure 5:
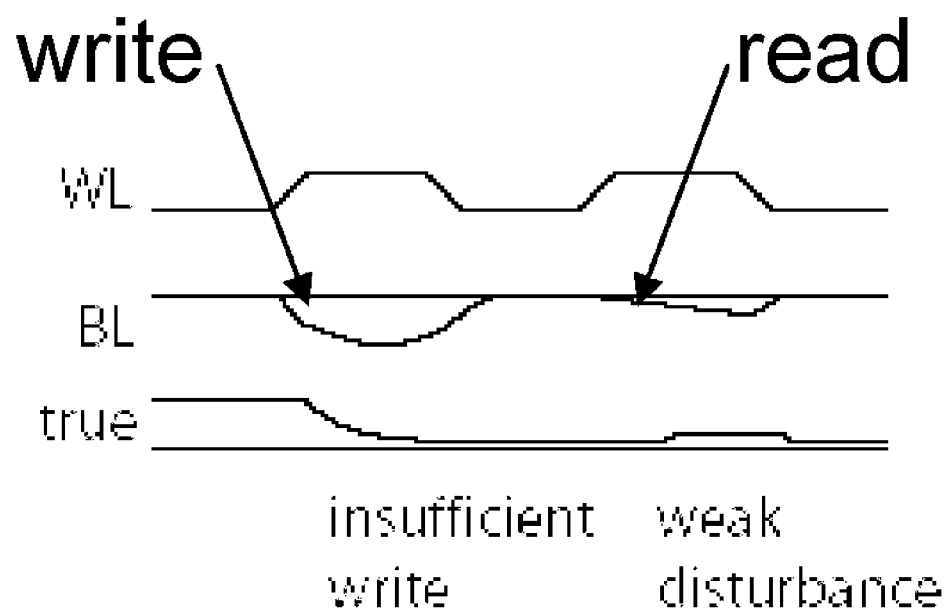
FIG. 5 is a waveform diagram of the operation of the memory cell as configured in FIG. 4.

On the other hand, as shown in FIG. 4, when the channel length of the data transfer transistor 105 is made longer than that of the NMOS pull-down driver transistor 103, the threshold voltage level that must be overcome by bit line BL is Vth+dVth/2, while the threshold voltage level that must be overcome by complementary bit line/BL is Vth−dVth/2. As shown in FIG. 5, when bit line BL is driven for a write operation to store a "0" bit value, the "true" level is not pulled down sufficiently to stably store a "0" value because of the higher threshold voltage value. And during a read operation, when bit line BL is pre-charged, there is created a weak disturbance for detection by the sense amplifier stage (not shown in FIG. 3), thus creating a less reliable read operation.

BROAD SCOPE OF THE INVENTION

While illustrative embodiments of the invention have been described herein, the present invention is not limited to the various illustrative embodiments described herein, but includes any and all embodiments having equivalent elements, modifications, omissions, combinations (e.g., of aspects across various embodiments), adaptations and/or alterations as would be appreciated by those in the art based on the present disclosure. The limitations in the claims (e.g., including that to be later added) are to be interpreted broadly based on the language employed in the claims and not limited to examples described in the present specification or during the prosecution of the application, which examples are to be construed as non-exclusive. For example, in the present disclosure, the term "preferably" is non-exclusive and means "preferably, but not limited to." In this disclosure and during the prosecution of this application, means-plus-function or step-plus-function limitations will only be employed where for a specific claim limitation all of the following conditions are present in that limitation: a) "means for" or "step for" is expressly recited; b) a corresponding function is expressly recited; and c) structure, material or acts that support that structure are not recited. In this disclosure and during the prosecution of this application, the terminology "present invention" or "invention" may be used as a reference to one or more aspect within the present disclosure. The language present invention or invention should not be improperly interpreted as an identification of criticality, should not be improperly interpreted as applying across all aspects or embodiments (i.e., it should be understood that the present invention has a number of aspects and embodiments), and should not be improperly interpreted as limiting the scope of the application or claims. In this disclosure and during the prosecution of this application, the terminology "embodiment" can be used to describe any aspect, feature, process or step, any combination thereof, and/or any portion thereof, etc. In some examples, various embodiments may include overlapping features. In this disclosure, the following abbreviated terminology may be employed: "e.g." which means "for example;" and "NB" which means "note well."

What is claimed is:

1. A memory cell, comprising:
   a word line;
   a bit line;
   a first node storing a bit value voltage level;
   a driver transistor coupled between said first node and a ground level; and
   at least one data transfer transistor having a gate electrode coupled to said word line,
   a source electrode coupled to said bit line, and a drain electrode coupled to said first node;
   wherein a channel length of said at least one data transfer transistor is smaller than a channel length of said driver transistor; and
   wherein a voltage threshold of said data transfer transistor is smaller than a voltage threshold of said driver transistor.

2. The memory cell as set forth in claim 1, wherein said driver transistor comprises a pull-down transistor, said memory cell further comprising a pull-up transistor coupled between said first node and a voltage supply.

3. The memory cell as set forth in claim 1, wherein where a voltage threshold of said driver transistor is denoted by dVth, a voltage threshold of said data transfer transistor is denoted by Vth−dVth/2.

4. The memory cell as set forth in claim 2, further comprising:
   a complementary bit line;
   a second pull-up transistor and a second pull-down transistor connected in series between said voltage supply and ground, a second node between said second pull-up and pull-down transistors storing a complementary bit value; and
   a second data transfer transistor coupled between said complementary bit line and said second node, and having a gate electrode coupled to said word line;
   wherein a channel length of said at least second data transfer transistor is smaller than a channel length of said second pull-down transistor.

5. A method of manufacturing a memory cell comprising:
   providing a data transfer transistor having a channel length smaller than a channel length of a bit value storing transistor to which said data transfer transistor is connected;
   the memory cell including:
   a word line;
   a bit line;
   a first node storing a bit value voltage level;
   a driver transistor coupled between said first node and a ground level; and
   at least one data transfer transistor having a gate electrode coupled to said word line, a source electrode coupled to said bit line, and a drain electrode coupled to said first node;
   wherein a channel length of said at least one data transfer transistor is smaller than a channel length of said driver transistor;
   and
   further including having said a voltage threshold of said data transfer transistor smaller than a voltage threshold of said driver transistor.

6. The method of claim 5, further including providing said channel length of said data transfer transistor smaller than said channel length of said bit value storing transistor to achieve stability.

7. The method of claim 6, further including achieving said stability by having said transfer transistor channel length reduced rather than reducing the drivability of the data transfer transistors.

8. The method of claim 5 further including having said driver transistor comprise a pull-down transistor, said memory cell further comprise a pull-up transistor coupled between said first node and a voltage supply.

9. The method of claim 5, further including having a voltage threshold of said driver transistor denoted by dVth, a voltage threshold of said data transfer transistor is denoted by Vth −dVth/2.

10. The method of claim 8, further including having said memory cell further include:
- a complementary bit line;
- a second pull-up transistor and a second pull-down transistor connected in series between said voltage supply and ground, a second node between said second pull-up and pull-down transistors storing a complementary bit value; and
- a second data transfer transistor coupled between said complementary bit line and said second node, and having a gate electrode coupled to said word line;
- wherein a channel length of said at least second data transfer transistor is smaller than a channel length of said second pull-down transistor.

11. A memory cell comprising:
- a word sine;
- a bit line;
- a complementary bit line;
- a first node storing a bit value voltage level;
- a second node storing a complementary bit value voltage level;
- a first pull-down driver transistor coupled between said first node and a ground level;
- a first pull-up transistor coupled between said first node and a supply voltage source;
- a first data transfer transistor having a gate electrode coupled to said word line, a source electrode coupled to said bit line, and a drain electrode coupled to said first node;
- a second pull-up transistor and a second pull-down transistor connected in series between said supply voltage source and ground; and
- a second data transfer transistor coupled between said complementary bit line and said second node, and having a gate electrode coupled to said word line;
- wherein a channel length of said first data transfer transistor is smaller than a channel length of said first pull-down driver transistor, and a channel length of said second data transfer transistor is smaller than a channel length of said second pull-down transistor; and
- wherein a voltage threshold of said data transfer transistor is smaller than a voltage threshold of said driver transistor.

12. A method of achieving stability for the manufacture a memory cell, comprising:
- providing a data transfer transistor having a reduced channel length as compared to a channel length of a bit value storing transistor to which said data transfer transistor is connected, and
- providing a voltage threshold of said data transfer transistor as smaller than a voltage threshold of said bit value storing transistor.

13. The method of achieving stability of claim 12, further including achieving said stability by having said transfer transistor channel length reduced rather than reducing the drivability of the data transfer transistors.

14. The method of claim 13, further including having said memory cell include:
- a word line;
- a bit line;
- a first node storing a bit value voltage level;
- a driver transistor coupled between said first node and a ground level; and
- at least one data transfer transistor having a gate electrode coupled to said word line, a source electrode coupled to said bit line and a drain electrode coupled to said first node;
- wherein a channel length of said at least one data transfer transistor is smaller than a channel length of said driver transistor.

* * * * *